United States Patent
Godet et al.

(10) Patent No.: US 9,823,570 B2
(45) Date of Patent: *Nov. 21, 2017

(54) FIELD GUIDED POST EXPOSURE BAKE APPLICATION FOR PHOTORESIST MICROBRIDGE DEFECTS

(71) Applicant: Applied Materials, Inc., Santa Clara, CA (US)

(72) Inventors: Ludovic Godet, Sunnyvale, CA (US); Sang Ki Nam, Danville, CA (US); Christine Y Ouyang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 14/677,552

(22) Filed: Apr. 2, 2015

(65) Prior Publication Data

US 2016/0291476 A1    Oct. 6, 2016

(51) Int. Cl.
*G03F 7/36* (2006.01)
*G03F 7/38* (2006.01)

(52) U.S. Cl.
CPC .................... *G03F 7/38* (2013.01)

(58) Field of Classification Search
CPC ................ G03F 7/3007; G03F 7/38
USPC ........................................ 430/328
See application file for complete search history.

(56) References Cited

U.S. PATENT DOCUMENTS

| | | |
|---|---|---|
| 5,258,266 A | 11/1993 | Tokui et al. |
| 6,242,164 B1 | 6/2001 | Choi et al. |
| 6,686,132 B2 | 2/2004 | Cheng et al. |
| 7,374,867 B2 | 5/2008 | Bristol et al. |
| 7,780,366 B2 * | 8/2010 | Ogata ................... G03F 7/162 355/27 |
| 8,097,402 B2 | 1/2012 | Scheer et al. |
| 9,377,692 B2 * | 6/2016 | Xie ......................... G03F 7/38 |
| 2007/0000613 A1 | 1/2007 | Pau et al. |
| 2008/0008967 A1 | 1/2008 | Chang et al. |
| 2009/0142926 A1 | 6/2009 | Dai et al. |
| 2012/0103939 A1 | 5/2012 | Wu et al. |
| 2012/0322011 A1 | 12/2012 | Wu et al. |
| 2014/0193755 A1 | 7/2014 | Wise et al. |

FOREIGN PATENT DOCUMENTS

KR    20140036166 A    3/2014

* cited by examiner

*Primary Examiner* — Daborah Chacko Davis
(74) *Attorney, Agent, or Firm* — Patterson + Sheridan LLP (57) ABSTRACT

Embodiments described herein generally relate to methods for mitigating patterning defects. More specifically, embodiments described herein relate to utilizing field guided post exposure bake processes to mitigate microbridge photoresist defects. An electric field may be applied to a substrate being processed during a post exposure bake process. Photoacid generated as a result of the exposure may be moved along a direction defined by the electric field. The movement of the photoacid may contact microbridge defects and facilitate the removal of the microbridge defects from the surface of a substrate.

20 Claims, 5 Drawing Sheets

FIELD GUIDED POST EXPOSURE BAKE APPLICATION FOR PHOTORESIST MICROBRIDGE DEFECTS

BACKGROUND

Field

The present disclosure generally relates to methods and apparatus for processing a substrate, and more specifically to methods and apparatus for reducing photoresist microbridge defects.

Description of the Related Art

Integrated circuits have evolved into complex devices that can include millions of components (e.g., transistors, capacitors, and resistors) on a single microchip. Photolithography is a process which may be utilized to pattern or shape various material layers during fabrication of the chip. Generally, the process of photolithography involves depositing a photoresist layer on a substrate, masking the substrate, and exposing the photoresist layer to electromagnetic radiation. The photoresist layer may be a chemically amplified photoresist and may include a resist resin and a photoacid generator. The photoacid generator, upon exposure to electromagnetic radiation, generates acid which alters the solubility of the photoresist in a development process. Excess solvent utilized in the development process and solvated resist may then be removed to reveal a patterned material layer suitable for subsequent fabrication processes.

Figure 1:
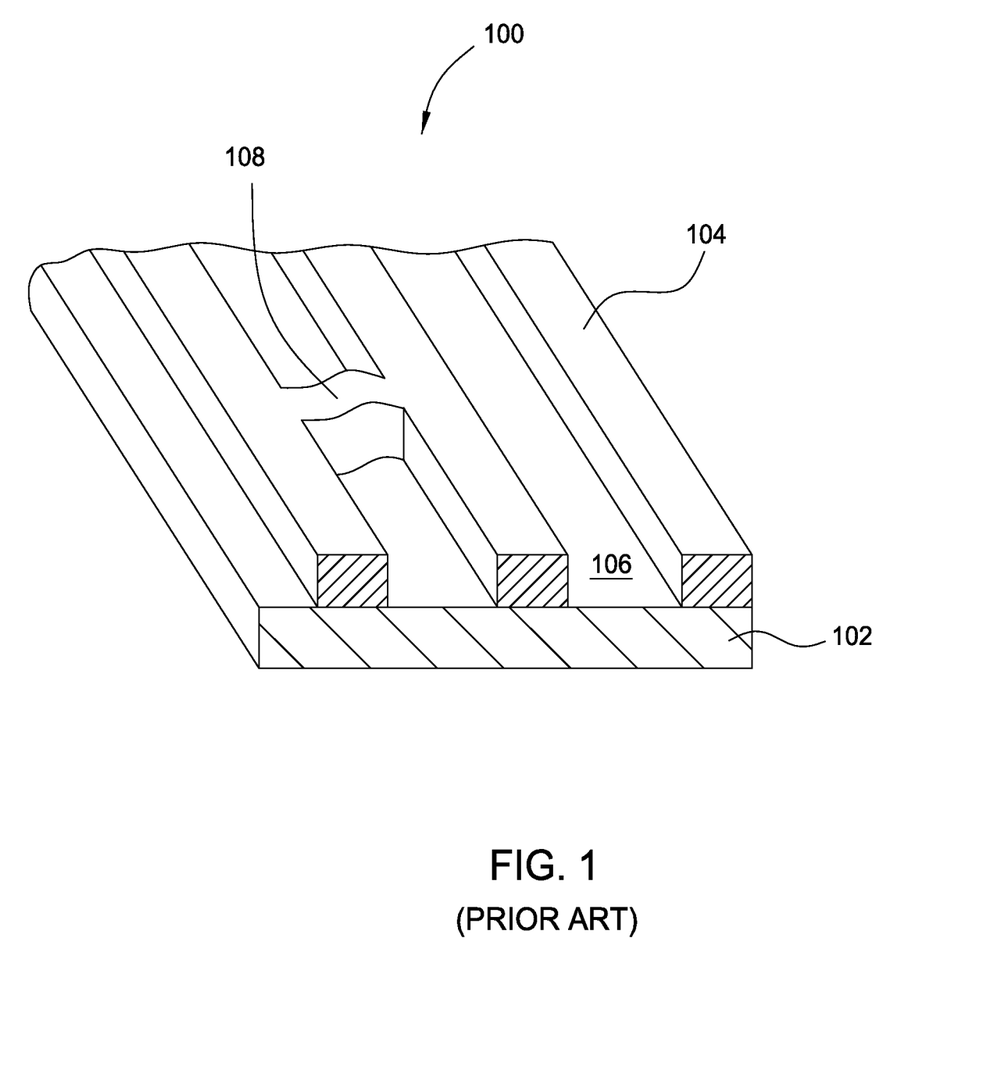
FIG. 1 (prior art) illustrates a perspective view of a patterned photoresist layer disposed on a substrate and a microbridge defect as conventionally known in the art.

During exposure of the photoresist, a photomask or reticle may be used to selectively expose certain regions of the photoresist layer to form a desired pattern on the substrate. However, the photomask or reticle utilized to pattern the photoresist may be defective and result in a patterned photoresist which is undesirable. A defect in patterning of the photoresist may result in the undesirable pattern being transferred to other layers on the substrate during subsequent processing operations. For example, as illustrated in FIG. 1 (prior art), a substrate 100 includes a material layer 102, a patterned resist layer 104, and exposed regions 106. A microbridge defect 108, which may result from defects during photolithography, undesirably bridges the exposed area 106 where no resist material should exist after exposure. Microbridge defects may result from mask defects or from defects in the photoresist, such as compositional heterogeneity with regard to photo acid generator concentration in specific regions of the photoresist. Microbridge defects are increasingly troublesome as critical device dimensions are continually shrinking. Additionally, microbridge defects reduce production yields and contribute to increased processing costs and reduced efficiencies.

Thus, there is a need for improved methods and an apparatus for reducing patterning defects in microelectronic devices.

SUMMARY

In one embodiment, a method of processing a substrate is provided. The method includes positioning a substrate having a photoresist material disposed thereon patterned with latent image lines in a processing chamber and heating the photoresist material. An electric field may be applied to the photoresist material in a direction parallel to the latent image lines and a photoacid distribution may be altered along the direction parallel to the latent image lines.

In another embodiment, a method of processing a substrate is provided. The method includes disposing a photoresist layer comprising a photoacid generator on a substrate and exposing a first portion of the photoresist layer unprotected by a photomask to electromagnetic radiation in a lithographic exposure process. An electric field may be applied to alter movement of photoacid generated from the photoacid generator in a direction parallel with a plane defined by the substrate. The electric field may be applied by a first alternating pair of positive and negative voltage antennae and a second alternating pair of positive and negative antennae.

In yet another embodiment, a method of processing a substrate is provided. The method includes disposing a photoresist layer comprising a photoacid generator on a substrate and exposing a first portion of the photoresist layer unprotected by a photomask to electromagnetic radiation in a lithographic exposure process to form one or more latent image lines. The substrate having the photoresist material disposed thereon patterned with latent image lines may be positioned in a processing chamber and the substrate and photoresist layer may be heated. An electric field may be applied to alter movement of photoacid generated from the photoacid generator in a direction parallel to the latent image lines. The applying an electric field includes charging a first antenna disposed above the photoresist layer and a second antenna disposed below the photoresist layer with a first voltage. The applying an electric field also includes charging a third antenna disposed above the photoresist layer and a fourth antenna disposed below the photoresist layer with a second voltage. The first and second voltages may have opposite polarities and the photoacid distribution may be altered along the direction parallel to the latent image lines.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments described herein generally relate to methods for mitigating patterning defects. More specifically, embodiments described herein relate to utilizing field guided post exposure bake processes to mitigate microbridge photoresist defects. An electric field may be applied to a substrate being processed during a post exposure bake process. Photoacid generated as a result of the exposure may be moved along a direction defined by the electric field. The movement of the photoacid may contact microbridge defects and facilitate the removal of the microbridge defects from the surface of a substrate.

Microbridge defects may result from a non-homogenous compositional profile of a photoresist or a photomask defect. Utilizing a photoacid generator during a post-exposure bake procedure in combination with an applied electric field may mitigate the occurrence of microbridge defects. Methods disclosed herein apply an electric field to a substrate on which the photoresist layer is disposed during a post-exposure bake operation of a photolithography processes. Application of the electric field as described herein controls the diffusion and distribution of the acids generated by the photoacid generator, reducing or preventing the microbridge defects as a result of selectively positioning the acids to solvate portions of the resist which exist as microbridge defects. Apparatuses and methods for performing the above-mentioned techniques are disclosed herein.

Figure 2:
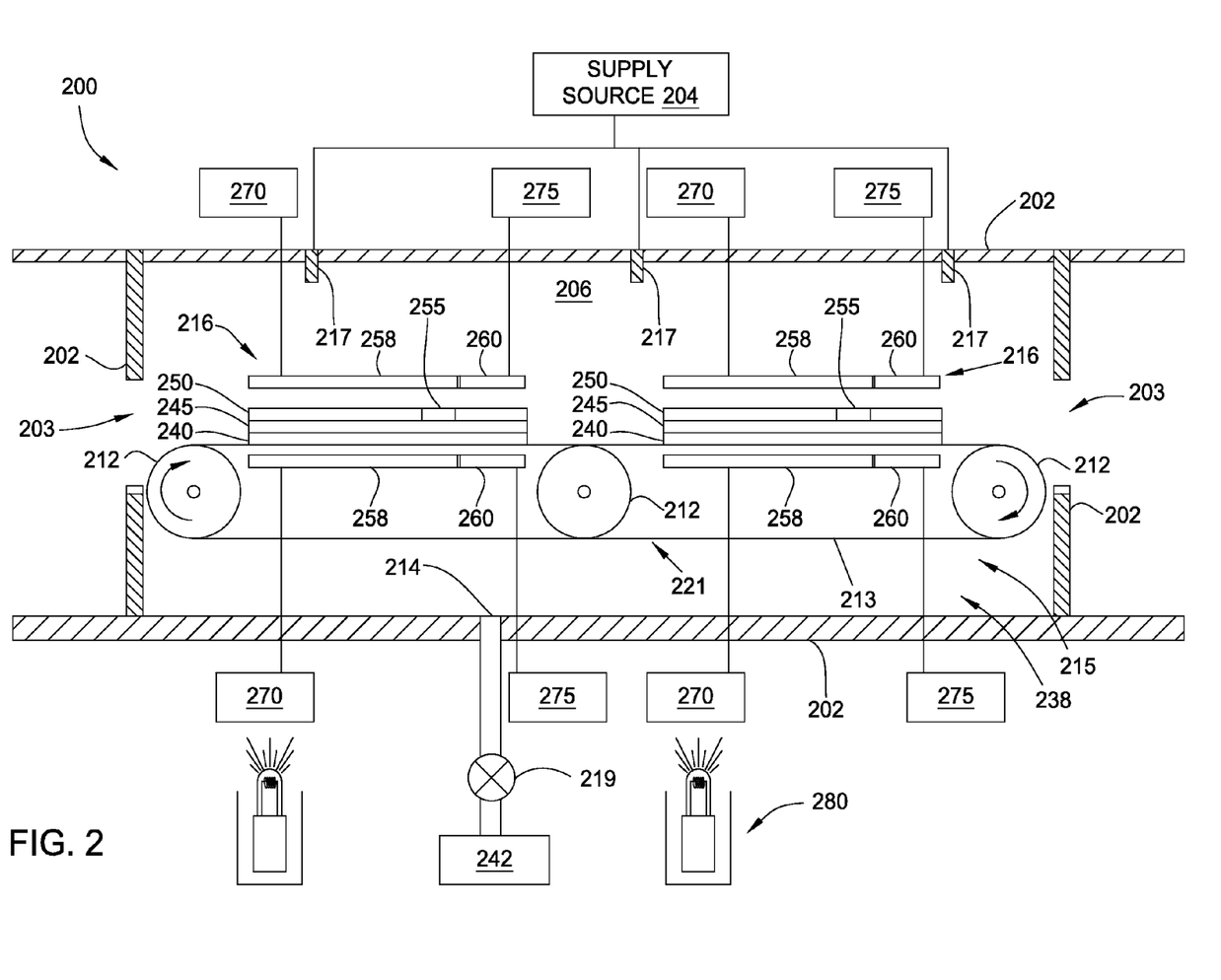
FIG. 2 illustrates a schematic, cross-sectional view of an apparatus for applying an electric field to a substrate on which a photoresist layer is disposed according to one embodiment described herein.

FIG. 2 illustrates a schematic side view of one embodiment of a processing chamber 200 in which a post-exposure bake procedure may be performed with an electric field applied to a substrate 240 in accordance with one embodiment described herein. As described above, the post-exposure bake procedure is performed after an exposure operation of a photolithography process, in which a photoresist layer 250 on the substrate 240 is exposed to electromagnetic radiation. The photoresist layer 250 may be formed on the substrate 240 and may include a resist resin and a photoacid generator. A mask or other mechanism is used to selectively expose the photoresist layer 250 to electromagnetic radiation. Exposure of portions of the photoresist layer 250 through openings in the mask causes a latent pattern to form in the photoresist layer 250, where the layout of the latent pattern is dependent on the layout of the mask. The latent pattern is characterized by a change in the chemical properties of the photoresist layer 250 such that subsequent processing can selectively remove desired portions of the photoresist layer 250. For example, the photoacid generated as a result of the exposure may function to solvate the photoresist layer 250 which may be removed during a subsequent photoresist removal process.

The post-exposure bake process may be performed after the exposure operation may include the application of heat to the photoresist layer 250. The application of heat may cause further changes to the chemical properties of the photoresist layer 250 such that a subsequent development operation will selectively remove the portions of the photoresist. The techniques disclosed herein include applying an electric field having a specified configuration during the post-exposure bake process such that a subsequent development operation will remove portions of the photoresist in a manner such that microbridge defects are reduced or eliminated.

The substrate 240 on which the photoresist layer 250 is disposed may be any suitable type of substrate, such as a dielectric substrate, a glass substrate, a semiconductor substrate, a conductive substrate, or the like. The substrate 240 may have a material layer 245 disposed thereon any may be any desired layer, such as a semiconducting material, or an oxide material, among others. In other embodiments, the substrate 240 may have more than one material layer 245. The substrate 240 may also have the photoresist layer 250 disposed over the material layer 245. When the post-exposure bake process is performed, the substrate 240 has been previously exposed to electromagnetic radiation in an exposure operation of a photolithography process. As a result, the photoresist layer 250 has latent image lines 255 which define a latent image of the electromagnetically-altered photoresist. The latent image lines 255 may be in a desirable pattern, for example, the latent image lines 255 may be substantially parallel to each other. In other embodiments, the latent image lines 255 may not be substantially parallel to each other.

The processing chamber 200 includes a substrate support assembly 238. The substrate support assembly 238 includes a substrate automation system 215 with a belt 213. The belt 213 may be moved via one or more rollers 212 which support and move the substrate 240. The processing chamber 200 may receive a linear array of substrates 240 through one or more apertures 203 formed in the sides of the processing chamber 200. The processing chamber 200 includes one or more electrode assemblies 216 configured to provide an electric field to the substrates 240 during the post-exposure bake process. The processing chamber 200 also includes a heating mechanism (discussed below) to apply heat to the substrate 240 while the electric field is applied for the post-exposure bake process.

The electrode assembly 216 includes at least a first electrode 258 and a second electrode 260. In some embodiments, the electrode assembly 216 may be coupled to one or more walls 202 by a fixed stem (not shown). As shown, the first electrode 258 is coupled to a power source 270, and the second electrode 260 is coupled to a power supply 275. Electrode assemblies 216 may be provided both above the belt 213 and below the belt 213 (and thus both above and below substrates 240 disposed on the belt) to provide a desired electric field configuration.

The substrate 240 may also be positioned in such a manner on the belt 213 such that the substrate is electrically floating. Thus, the substrate 240 is not electrically coupled to any conductive elements of the processing chamber 200 or to ground. The processing chamber 200 may include one or more features to electrically float the substrate 240. In one example, the belt 213 may have an electrically insulating material disposed on a top surface of the belt 213. In this example, the substrate 240 may be placed on the electrically insulating material on the belt 213 in order to electrically float the substrate 240 within the chamber 200. In another example, the substrate 240 may be disposed on the belt, which is electrically isolated from other components of the processing chamber 200. In yet another example, the processing chamber 200 includes an electrically floating arm or other apparatus upon which the substrate 240 is disposed. Electrically floating the substrate 240 influences the shape of the electrical field applied by the electrode assembly 216 into a desired configuration. More specifically, electrically floating the substrate 240 may influence electric field line shape and cause the electric field lines to remain substantially parallel to the top (and/or bottom) surface of the substrate 240, which is generally parallel to the surface of the belt 213.

The processing chamber 200 may also include one or more heat sources 280 to provide heat to the photoresist layer 250 during the post-exposure bake process. One example of the heat source 280, as illustrated in FIG. 2, includes one or more heat lamps positioned within or outside the processing chamber 200. In another example of a heat source, one or more lasers may be used to heat the photoresist layer 250 (or other layer) positioned on the substrate 240. In a further example of a heat source, the supply source 204 may be configured to provide heated gas to the processing chamber 200 in order to heat the photoresist layer 250. In yet another example of a heat source, a microwave heater may be used to heat the photoresist layer 250. In still another example of the heating mechanism, instead of using a belt 213, the substrate 240 may instead be supported by an arm that is heated and thus conductively transfers that heat to the photoresist layer 250. In such embodiments, the arm may be electrically floating or a surface of the arm that supports the substrate 240 may include an electrically insulating layer to cause the substrate 240 to be electrically floating.

The configuration of the electrode assemblies 216 and the electrical floating of the substrate 240 define a desired electric field configuration. More specifically, the electrode assembly 216 is configured to generate an electric field parallel to the x-y plane defined by the surface of the belt 213. The electrical floating of the substrate 240, among other variables, causes the electric field to be substantially parallel to the surface of the substrate 240 along a substantially large portion of the substrate 240. Moving the substrate 240 via the belt 213 through the processing chamber while the electric field and heat are applied may cause the charged species to move in a desired direction to solvate any photoresist present on the substrate 240 as a microbridge defect. The charged species may be the acids described above that are present in the photoresist layer. These acids may be charged, and thus an electric field may affect motion of the charged species.

When applying the electric field and heating the substrate 240, the processing chamber 200 may be filled with a non-reactive gas. The processing chamber 200 may also be under vacuum generated by a vacuum pump 242 during the post-exposure bake process. The processing chamber 200 may be enclosed by a plurality of walls 202. The walls 202 are generally formed from a material suitable for structurally supporting the loads applied by the external environment, such as aluminum, stainless steel, or alloys and combinations thereof.

The apertures 203 may be sealed with a sealing mechanism, such as a slit valve, when the post-exposure bake process is performed to allow a vacuum to be generated in the interior of the processing chamber 200. A vacuum port 214 may be present in any one of the walls 202 to allow a vacuum pump 242 to generate vacuum via valve 219. The vacuum pump 242 may reduce the pressure within the processing chamber 200 and exhaust any gases and/or process by-products out of the processing chamber 200. Gas inlets 217 allow a supply source 204 to provide gases to the interior of the processing chamber 200.

In the example illustrated in FIG. 2, the substrate automation system 215 includes a conveyor 221 that is adapted to support and guide substrates 240 through the processing chamber 200 by use of one or more actuators (not shown), for example, a stepper motor or servo motor. In one configuration, the conveyor 221 comprises two or more rollers 212 and a belt 213 that are configured to support and move the substrates 240 through the processing chamber 200. In various embodiments, the processing chamber 200 may comprise other types of processing chambers. For example, instead of a processing chamber with conveyor belt, the processing chamber 200 may be a single substrate processing chamber or a batch processing chamber. The processing chamber 200 may also be part of a processing system, such as an in-line processing system, a cluster processing system, or the track processing system as desired.

The power source 270 and the power supply 275 may have various characteristics in order to provide the electric field described above. For example, the power source 270 and the power supply 275 may be configured to supply between about 500 V and about 100 kV to the electrode assembly 216. An electric field may be generated having a strength between about 0.1 MV/m and about 100 MV/m. In one embodiment, the field strength may be between about 1 MV/meter and about 5 MV/meter, such as about 2 MV/meter. In some embodiments, either or both of the power source 270 or the power supply 275 are a pulsed direct current (DC) power supply. The pulsed DC wave may be from a half-wave rectifier or a full-wave rectifier. The DC power may have a frequency of between about 0 Hz and 1 MHz. The duty cycle of the pulsed DC power may be from between about 5% and about 95%, such as between about 20% and about 60%. In some embodiments, the duty cycle of the pulsed DC power may be between about 20% and about 40%. In other embodiments, the duty cycle of the pulsed DC power may be about 60%. The rise and fall time of the pulsed DC power may be between about 1 ns and about 1000 ns, such as between about 10 ns and about 500 ns. In other embodiments, the rise and fall time of the pulsed DC power may be between about 10 ns and about 100 ns. In some embodiments, the rise and fall time of the pulsed DC power may be about 500 ns.

In some embodiments, either or both of the power source 270 and the power supply 275 are an alternating current power supply. The waveform applied by such an alternating current power supply may be a sinusoidal waveform. The frequency of such a sinusoidal waveform may be from between 1 Hz to 1 KHz, although the frequency is not limited to those numbers. This AC waveform may be combined with a pulse, as well. In other embodiments, either or both of the power source 270 and the power supply 275 are a direct current power supply. In some embodiments, either or both of the power source 270 and the power supply 275 may use a DC offset. The DC offset may be, for example, between about 0% and about 75% of the applied voltage, such as between about 5% and about 60% of the applied voltage.

Figure 3:
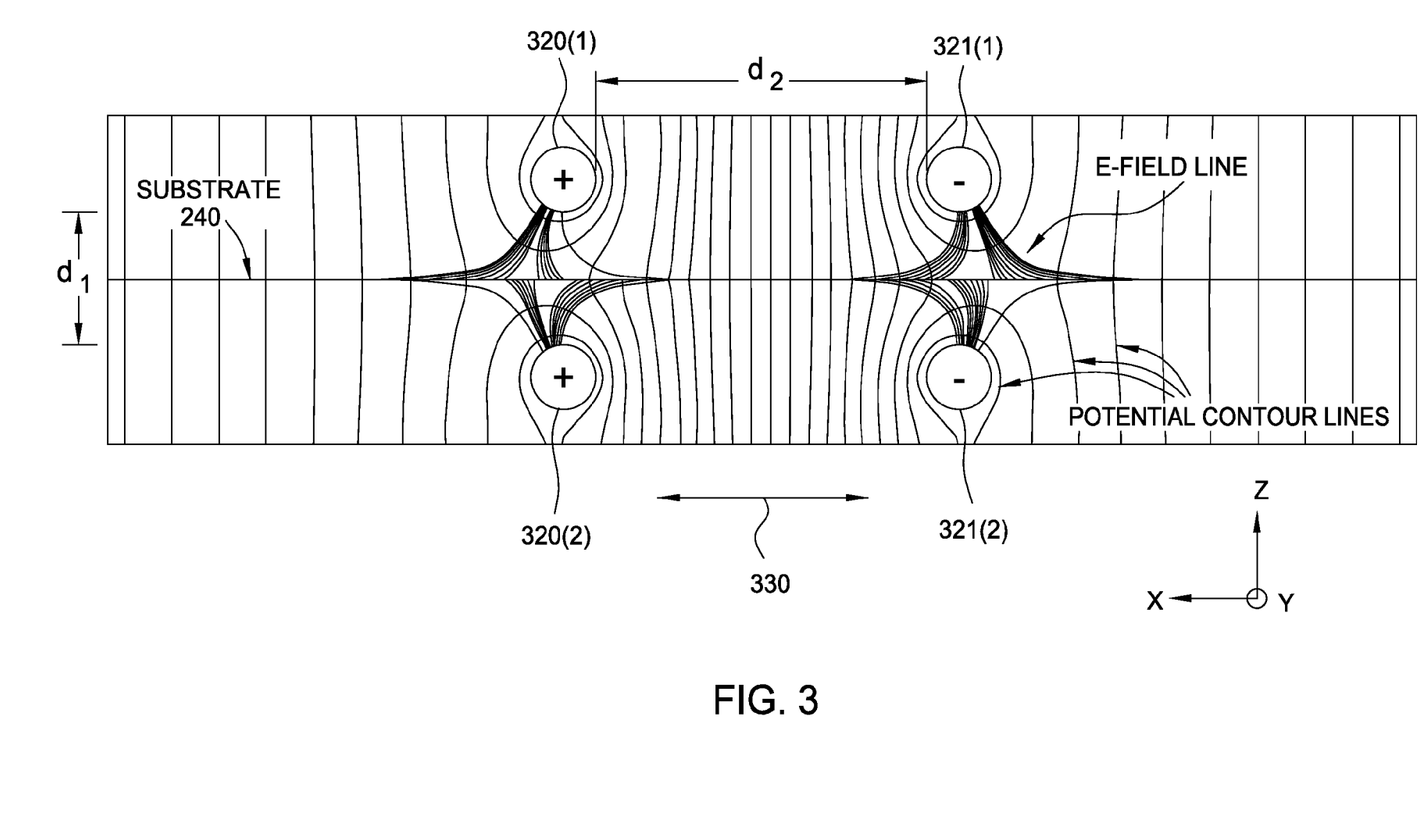
FIG. 3 illustrates a schematic, side view of antennas configured to apply an electric field to the photoresist layer of the substrate according to one embodiment described herein.

FIG. 3 illustrates a schematic side view of pairs of antennas 320, 321 above and below a substrate 240 that includes a photoresist layer 250 (shown in FIG. 2). The electrode assembly 216 (also shown in FIG. 2), which is positioned above and below substrate 240, includes the antennas 320, 321. The antennas 320, 321 are configured to provide an electric field within the processing chamber 200 influence the position of photoacid generated by the photoresist layer 250 after an exposure operation. FIG. 3 shows an exemplary configuration of the electric field that is produced by the antennas 320, 321.

As illustrated, an antenna 320(1) having a positive voltage is disposed above the substrate 240 and an antenna 320(2) having substantially the same voltage as the antenna 320(1) is disposed below the substrate. Antenna 320(1) is spaced apart from antenna 320(2) by distance $d_1$. Also, an antenna 321(1) is disposed above the substrate 240 and is spaced apart from antenna 320(1) by distance $d_2$. Antenna 321(2) is disposed below the substrate 240 and is spaced apart from antenna 321(1) by $d_1$ and from antenna 320(2) by $d_2$. Antenna 321(1) and antenna 321(2) have a negative voltage as compared with antenna 320(1) and 320(2). Antenna 321(1) and antenna 321(2) have substantially the same voltage. This configuration, in which two vertically aligned "positive" antennas and two vertically aligned "negative" antennas are disposed above and below the substrate 240, forms an electric field with desirable characteristics parallel to the surface of the photoresist 250.

When the substrate 240, with photoresist 250, is heated in the presence of an electric field generated by the antennas 320, 321 disposed both above and below the substrate 240, a uniformity of directional movement is applied to charged species (i.e., protons of the photoacid). The uniform directional movement of the charged species is shown by the double headed arrow 330.

For clarity, only two pairs of antennas 320, 321 are shown. However, it is contemplated that additional antennas may be present in the processing chamber as well. For example, antennas 320, 321 in a horizontal alignment or stacked vertical alignment may also be utilized to form a suitable electric field.

In operation, a voltage may be supplied from a power supply, such as the power source 270 and/or the power supply 275, to the first terminal 310 and/or the second terminal 311. The supplied voltage creates an electric field between each antenna of the one or more antennas 320 and each antenna of the one or more antennas 321. The electric field will generally be strongest between an antenna of the one or more antennas 320 and an adjacent antenna of the one or more antennas 321. The antennas 320, 321 may be interleaved and aligned in a spatial relationship configured to produce an electric field predominantly in a direction parallel to the plane defined by the surface of the belt 213 (i.e., the X-Y plane).

The substrate 240 is positioned on the belt 213 such that the latent image lines 255 are parallel to the electric field lines generated by the electrode assembly 216. As a result of the protons generated by the photoacid, the charged species may be influenced by the electric field. As such, the electric field drives the charged species generated by the photoacid in the photoresist layer 250 in the direction of the electric field. By driving the charged species in a direction parallel with the latent image lines 255, any existing microbridge defect may be exposed to and contacted the charged species to solvate the photoresist comprising the microbridge defect. In contrast, when a voltage is not applied to the first terminal 310 and/or the second terminal 311, an electric field is not created to drive the charged species in any particular direction. As a result, the charged species may move randomly, which provides no controlled microbridge defect removal and may also undesirably result in increased line edge roughness.

Figure 4A:
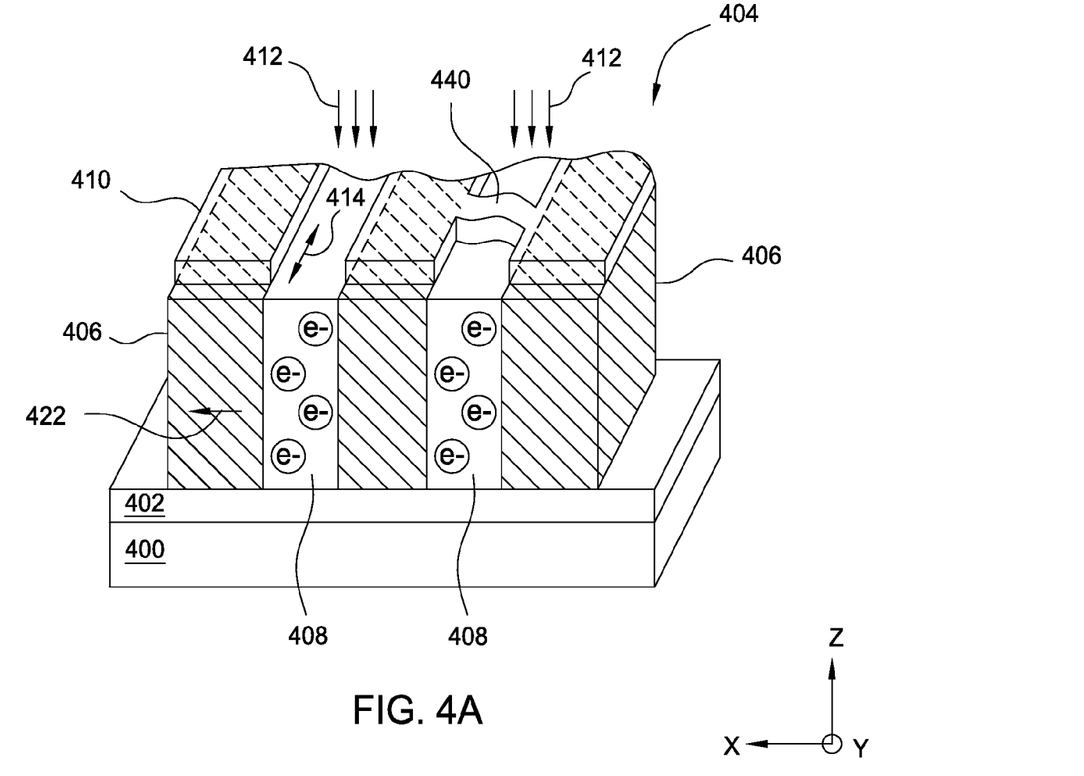
FIG. 4A illustrates a perspective view of the substrate depicting an acid distribution control of the photoresist layer during a post exposure bake process according to one embodiment described herein.

FIG. 4A illustrates a photoresist layer 404 disposed on a material layer 402 formed on a substrate 400 during a lithography exposure process. As discussed above, an electric field from the electrode assembly 216 is applied during a post exposure baking process. During the lithographic exposure process, radiation 412 is directed to a first region 408 of the photoresist layer 404 while with a second region 406 of the photoresist layer 404 protected by a photomask 410. Photoacid, depicted as $e^-$ in FIG. 4A, is generated in the exposed first region 408 in the photoresist layer 404 when the photoacid generator (PAG) is exposed to the radiation 412, such as ultraviolet (UV) radiation. A microbridge defect 440 is illustrated as remaining in the first region 408, which may be a result of a non-homogenous distribution of PAG in the photoresist layer 404 or may be the result of a defect in the photomask 410. Although FIG. 4A illustrates the photoacid with an "$e^-$" symbol, it is not specifically intended to be reflective of the actual charge of photoacid compounds, rather, it is representative of the fact that photoacid compounds generally are electrically charged.

More specifically, the photoacid generator generates charged species, such as an acid cation and an anion. The photoacid generator may also generate polarized species. Representative photoacid generators include sulfonate compounds, such as, for example, sulfonated salts, sulfonated esters, and sulfonyloxy ketones. Other suitable photoacid generators include onium salts, such as aryl-diazonium salts, halonium salts, aromatic sulfonium salts and sulfoxonium salts or selenium salts. Other representative photoacid generators include nitrobenzyl esters, s-triazine derivatives, ionic iodonium sulfonates, perfluoroalkanesulfonates, aryl triflates and derivatives and analogs thereof, pyrogallol derivatives, and alkyl disulfones. Other photoacid generators may also be used.

In a conventional process, photoacid is primarily generated in the exposed first region 408 of the photoresist layer 404 during the lithographic exposure process. During the post-exposure bake period, movement of photoacid is generally random and the interface between areas within the photoresist layer 404 that include the generated photoacid and areas that do not include the generated photoacid may comprise an unclear boundary (i.e., interface 430). For example, the random movement may result in at least a portion of the photoacid diffusing into the second region 406, as shown in the arrow 422. Such photoacid drift may result in line edge roughness, resolution loss, photoresist footing, and profile deformation, which may cause inaccurate transfer of features to the underlying material layer 402. Moreover, mitigation of microbridge defects cannot be adequately addressed with random movement of the photoacid. As a result, inaccurate transfer of features could lead to device failure.

By applying the electric field described above to the photoresist layer 404 during the post-exposure bake process, distribution of photoacid in the exposed first region 408 may be efficiently controlled and confined. The electric field as applied to the photoresist layer 404 may move photoacid in a direction parallel to the latent image lines (e.g., the y-direction shown by arrow 414, which is substantially parallel to the planar surface of the substrate 400) with minimal lateral motion (e.g., x direction shown by the arrow 422). As such, the photoacid generally does not diffuse into the adjacent second region 406. Generally, photoacid has a certain polarity that may be affected by an electric field applied thereto. Such an applied electric field will orient photoacid molecules in directions that are in accordance with the electric field. When such electric field is applied, the photoacid moves in a desired direction such that the photoacid may contact and solvate microbridge defects 440 which are disposed within an area along the field direction.

Figure 4B:
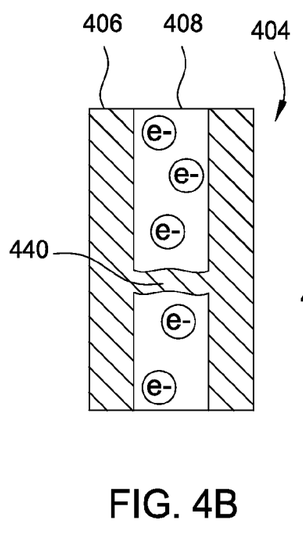
FIG. 4B illustrates a partial schematic top view of a photoresist layer of FIG. 4A including a portion of a first region and the second region with a microbridge defect after lithographic exposure according to one embodiment described herein.

FIG. 4B illustrates a partial schematic top view of the photoresist layer 404 of FIG. 4A including a portion of the first region 408 and the second region 406 with the microbridge defect 440 after lithographic exposure. The microbridge defect 440, as described above, may be present as a result of a photomask defect or non-homogenous distribution of PAG within the photoresist. This is illustrated as photoacid (e⁻) present in the first region 408, but not present where the microbridge defect 440 exists.

Figure 4C:
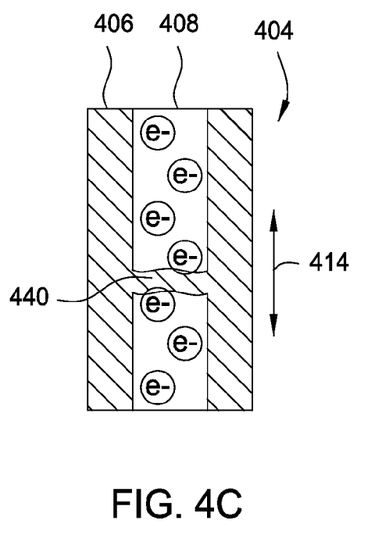
FIG. 4C illustrates a partial schematic top view of the photoresist layer of FIG. 4B including a portion of the first region and the second region with the microbridge defect during the field guided post exposure bake process according to one embodiment described herein.

FIG. 4C illustrates a partial schematic top view of the photoresist layer 404 of FIG. 4B including a portion of the first region 408 and the second region 406 with the microbridge defect 440 during the field guided post exposure bake process. During the field guided post exposure bake process, the electric field in applied in a desired direction, for example, parallel to the latent image lines illustrated. The direction of the field is illustrated by arrow 414. Accordingly, the photoacid is moved along the direction of the field such that the photoacid is moved into contact with the microbridge defect 440. The field guided post exposure bake process may be performed for an amount of time suitable to solvate and/or remove the microbridge defect 440.

Figure 4D:
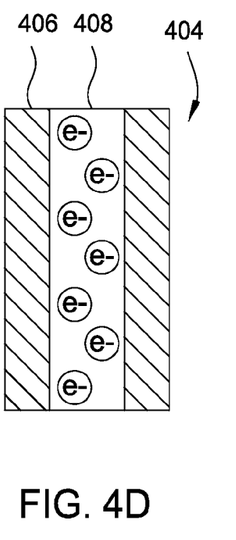
FIG. 4D illustrates a partial schematic top view of the photoresist layer of FIG. 4C including a portion of the first region and the second region after the field guided post exposure bake process has removed the microbridge defect according to one embodiment described herein.

FIG. 4D illustrates a partial schematic top view of the photoresist layer 404 of FIG. 4C including a portion of the first region 408 and the second region 406 after the field guided post exposure bake process has removed the microbridge defect 440. As illustrated, the microbridge defect 440 has been removed as a result of the controlled migration and movement of the photoacid which is now present where the microbridge defect 440 once existed.

Figure 5:
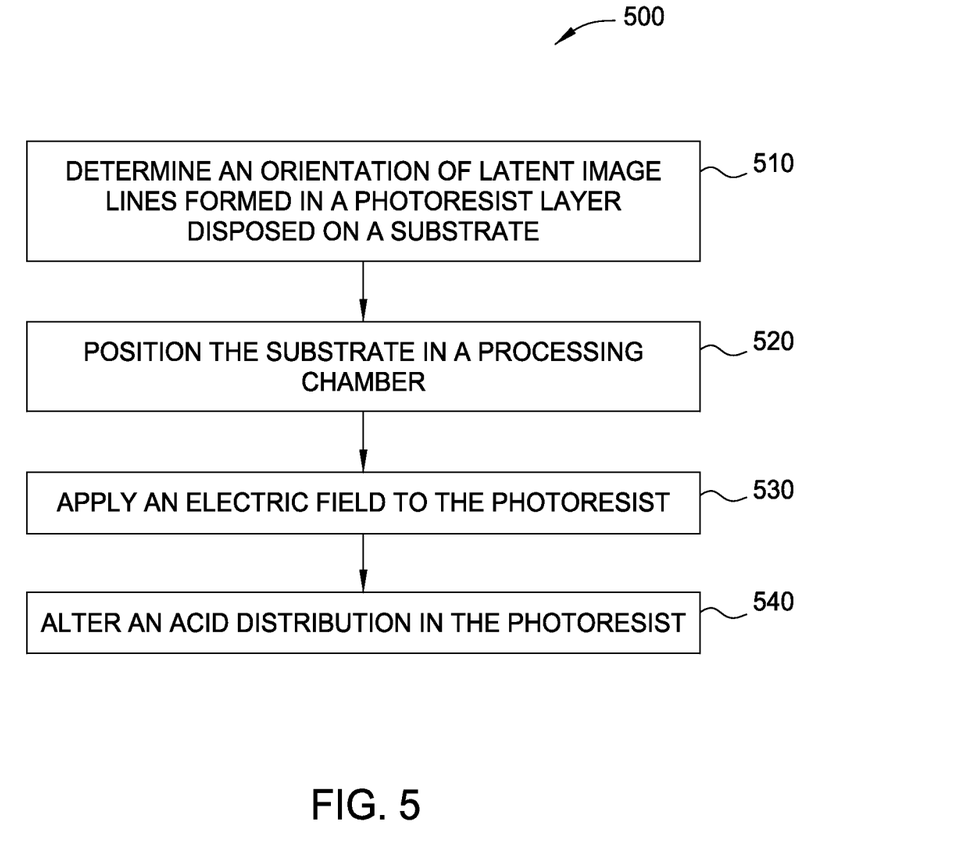
FIG. 5 illustrates a flow diagram of a method for controlling acid distribution of a photoresist layer during a post-exposure bake process according to one embodiment described herein.

FIG. 5 illustrates a flow diagram of a method 500 for controlling photoacid distribution/diffusion in a photoresist layer during a lithographic exposure process or during a prebaking process or a post-baking process. The method 500 begins at operation 510 by determining an orientation of latent image lines formed in a photoresist layer disposed on a substrate. In one embodiment, the latent image lines may be substantially parallel and the orientation of the lines on the substrate may be determined by various suitable methods. In certain embodiments, the determining the orientation of the latent image lines may be optional.

At operation 520, the substrate may be positioned in a suitable processing chamber. Generally, the processing chamber, such as the processing chamber 200 described in FIG. 2, may have a plurality of antennas configured to generate an electric field. In one embodiment, the substrate may be positioned within the processing chamber such that the orientation of the latent image lines is parallel with the electric field generated by the antennas.

At operation 530, an electric field may be applied to the photoresist. Prior to, during, or subsequent to the application of the electric field, the substrate may be heated to a suitable temperature to facilitate photoacid movement. For example, the photoresist may be maintained at a temperature between about 10° C. and about 160° C., such as between about 30° C. and 140° C. In one embodiment, the electric field is applied during a baking process and the electric field is applied parallel to latent image line formed on the photoresist.

At operation 540, an acid distribution within the photoresist may be altered. The alteration or movement and migration of photoacid within the resist is controlled by the application of the electric field described with regard to operation 530. The electric field may be applied to the photoresist for an amount of time suitable to remove any microbridge defects present on the substrate. For example, the electric field may be applied between about 30 seconds and about 120 seconds. It is also contemplated that the electric field may be applied even if no microbridge defects exist to improve line edge roughness for subsequent pattern image transfer.

In addition, the photoresist may optionally be developed. In one embodiment, after the completion of operation 540, the substrate 140 may be transferred to a development chamber. The photoresist may be developed by, for example, exposing the photoresist to a developer, such as a sodium hydroxide solution, a tetramethylammonium hydroxide solution, xylene, or Stoddard solvent. The substrate may be rinsed with, for example, water or n-butylacetate.

Additional post-processing steps may also be performed. The additional post-processing steps may be performed, for example, in a post-processing chamber. For example, after rinsing, the substrate may be hard baked and inspected. After inspection, an etching process may be performed on the substrate. The etching process may generally utilize the features of photoresist, such as the latent image lines to transfer a pattern to the substrate.

Although described above in the context of mitigating microbridge defects and line edge roughness, the techniques provided above may additionally be used to improve the sensitivity of photoresist. This sensitivity is associated with the reaction that makes the photoresist soluble. By applying the electromagnetic field techniques described above, the reaction that causes the photoresist to become soluble is sped up, which improves the sensitivity.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, comprising:
    positioning a substrate having a photoresist material disposed thereon patterned with latent image lines in a processing chamber;
    heating the photoresist material;
    applying an electric field to the photoresist material in a direction parallel to the latent image lines; and
    controlling a photoacid migration along the direction parallel to the latent image lines.

2. The method of claim 1, further comprising exposing the photoresist material to electromagnetic radiation.

3. The method of claim 1, wherein heating the photoresist material comprises:
    heating the photoresist material to a temperature of between about 30° C. and 140° C.

4. The method of claim 1, wherein applying the electric field comprises:
    maintaining a field strength of the electric field of between about 1 MV/meter and about 5 MV/meter.

5. The method of claim 4, wherein applying the electric field comprises:
    pulsing direct current to an electrode assembly.

6. The method of claim 4, wherein applying the electric field comprises:
    pulsing an alternating current to an electrode assembly.

7. The method of claim 1, wherein applying the electric field comprises:
    applying a voltage having a first polarity to a first antenna and applying a voltage having a second polarity that is opposite the first polarity to a second antenna.

8. The method of claim 7, wherein the first antenna is disposed above the substrate and the second antenna is disposed below the substrate.

9. The method of claim 1, wherein the photoresist material comprises a photoacid generator.

10. A method of processing a substrate, the method comprising:
  disposing a photoresist layer comprising a photoacid generator on a substrate;
  exposing a first portion of the photoresist layer unprotected by a photomask to electromagnetic radiation in a lithographic exposure process; and
  applying an electric field by applying positive and negative voltages to a first pair of antennae and a second pair of antennae to control migration of photoacid generated from the photoacid generator in a direction parallel with a plane defined by a surface of the substrate.

11. The method of claim 10, further comprising:
  electrically floating the substrate.

12. The method of claim 10, wherein the electric field is applied to the photoresist layer during a post-exposure bake process performed after the lithographic exposure process.

13. The method of claim 10, wherein applying the electric field further comprises:
  the controlling photoacid migration in a direction parallel to one or more latent image lines formed in the photoresist layer by the lithographic exposure process.

14. The method of claim 10, wherein applying the electric field further comprises:
  charging a first antenna disposed above the photoresist layer and a second antenna disposed below the photoresist layer with a first voltage; and
  charging a third antenna disposed above the photoresist layer and a fourth antenna disposed below the photoresist layer with a second voltage, wherein the first and second voltages have opposite polarities.

15. The method of claim 14 further comprising:
  moving the substrate via a conveyor belt.

16. The method of claim 14, wherein the first voltage and the second voltage each comprises one of a direct current voltage, an alternating current voltage, or a pulse.

17. The method of claim 10, further comprising:
  heating the photoresist layer to a temperature between about 30° C. and 140° C.

18. A method of processing a substrate, comprising:
  disposing a photoresist layer comprising a photoacid generator on a substrate;
  exposing a first portion of the photoresist layer unprotected by a photomask to electromagnetic radiation in a lithographic exposure process to form one or more latent image lines;
  positioning the substrate having the photoresist material disposed thereon patterned with latent image lines in a processing chamber;
  heating the substrate and the photoresist layer;
  applying an electric field to control migration of photoacid generated from the photoacid generator in a direction parallel to the latent image lines, wherein the applying an electric field comprises:
    applying a first voltage to a first antenna disposed above the photoresist layer and a second antenna disposed below the photoresist layer; and
    applying a second voltage to a third antenna disposed above the photoresist layer and a fourth antenna disposed below the photoresist layer, wherein the first and second voltages have opposite polarities.

19. The method of claim 18, wherein the first voltage and the second voltage each comprises one of a direct current voltage, an alternating current voltage, or a pulse.

20. The method of claim 18, wherein the substrate and the photoresist layer are heated to a temperature between about 30° C. and 140° C.

* * * * *